(12) United States Patent
Chueh et al.

(10) Patent No.: US 9,460,919 B1
(45) Date of Patent: Oct. 4, 2016

(54) MANUFACTURING METHOD OF TWO-DIMENSIONAL TRANSITION-METAL CHALCOGENIDE THIN FILM

(71) Applicant: NATIONAL TSING HUA UNIVERSITY, Hsinchu (TW)

(72) Inventors: Yu-Lun Chueh, Hsinchu (TW); Yu-Ze Chen, Tainan (TW); Yi-Chen Hsieh, Kaohsiung (TW); Henry Medina, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 15/060,615

(22) Filed: Mar. 4, 2016

(30) Foreign Application Priority Data

Oct. 7, 2015 (TW) .................................. 104133059

(51) Int. Cl.
*H01L 21/02* (2006.01)

(52) U.S. Cl.
CPC ..... *H01L 21/02568* (2013.01); *H01L 21/0259* (2013.01); *H01L 21/02378* (2013.01); *H01L 21/02488* (2013.01); *H01L 21/02614* (2013.01); *H01L 21/02631* (2013.01)

(58) Field of Classification Search
CPC ........... H01L 31/0321; H01L 31/0325; H01L 21/02568
See application file for complete search history.

(56) References Cited

U.S. PATENT DOCUMENTS

| 2008/0314738 A1 | 12/2008 | Gopalakrishnan et al. |
| 2014/0251204 A1 | 9/2014 | Najmaei et al. |
| 2014/0332814 A1* | 11/2014 | Peng et al. .......... H01L 21/0262 257/49 |
| 2015/0159265 A1 | 6/2015 | Kim et al. |

OTHER PUBLICATIONS

Yu-Ze Chen et al., "Low-Temperature and Ultrafast Synthesis of Patternable Few-Layer Transition Metal Dichacogenides with Controllable Stacking Alignment by a Microwave-Assisted Selenization Process," Chemistry of materials, published on Jan. 6, 2016, vol. 28, Issue 4, pp. 1147-1154, published by American Chemical society, United States.

* cited by examiner

*Primary Examiner* — Mohammad Choudhry
(74) *Attorney, Agent, or Firm* — CKC & Partners Co., Ltd.

(57) ABSTRACT

A manufacturing method of a two-dimensional transition-metal chalcogenide thin film includes providing a substrate, providing a reaction film, providing a source and providing a microwave. The substrate is made of material having dipole moments. The reaction film, disposed on the substrate, has a predefined thickness and includes a transition-metal compound. The source includes S, Se, or Te. The substrate is heated by the microwave to produce a heat energy to the reaction film and the source; thus a chemical reaction takes place and the two-dimensional transition-metal chalcogenide thin film is formed on the substrate. The two-dimensional transition-metal thin film includes a plurality of elements, and each of the elements aligns along a predefined direction by controlling a value of the predefined thickness.

15 Claims, 6 Drawing Sheets

MANUFACTURING METHOD OF TWO-DIMENSIONAL TRANSITION-METAL CHALCOGENIDE THIN FILM

RELATED APPLICATIONS

This application claims priority to Taiwan Application Serial Number 104133059, filed Oct. 7, 2015, which is herein incorporated by reference.

BACKGROUND

1. Technical Field

The present disclosure relates to manufacturing method two-dimensional thin film. More particularly, the present disclosure relates to a manufacturing method of a two-dimensional transition-metal chalcogenide thin film.

2. Description of Related Art

Silicon has been the main material for semiconductors for a long time. However, the manufacturing process of Si-based semiconductors has reached a limitation as the size of semiconductor becomes miniaturized. Therefore, scientists start to, introduce new materials, such as graphene, transition-metal chalcogenide, etc. Transition-metal chalcogenide has an inherent band gap, and transition-metal chalcogenide has direct band gap when becoming a single-layer structure; thus the single-layer transition-metal chalcogenide has a great potential in optoelectronic characters.

The way to manufacturing the single-layer transition-metal chalcogenide chamber needs to be heated during the manufacturing process, the manufacturing cost as well as the heating cost increases. Besides, the cycle time becomes longer due to the long processing time.

Base on the aforementioned problems, how to decrease the processing time and the heating cost for manufacturing single-layer transition-metal chalcogenide becomes a pursuit target for practitioners.

SUMMARY

According to one aspect of the present disclosure, a manufacturing method of a two-dimensional transition-metal chalcogenide thin film includes Steps as follows. A substrate is provided, wherein the substrate is made of material having dipole moments. A reaction film is provided, wherein the reaction film is disposed on the substrate, and the reaction film has a predefined thickness and includes a transition-metal compound. A source is provided, wherein the source includes S, Se, or Te. A microwave is provided, wherein the substrate is heated by the microwave to produce a heat energy to the reaction film and the source; thus a chemical reaction takes place and the two-dimensional transition-metal chalcogenide thin film is formed on the substrate. The two-dimensional transition-metal thin film includes a plurality of elements, and each of the elements aligns along a predefined direction by controlling a value of the predefined thickness.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
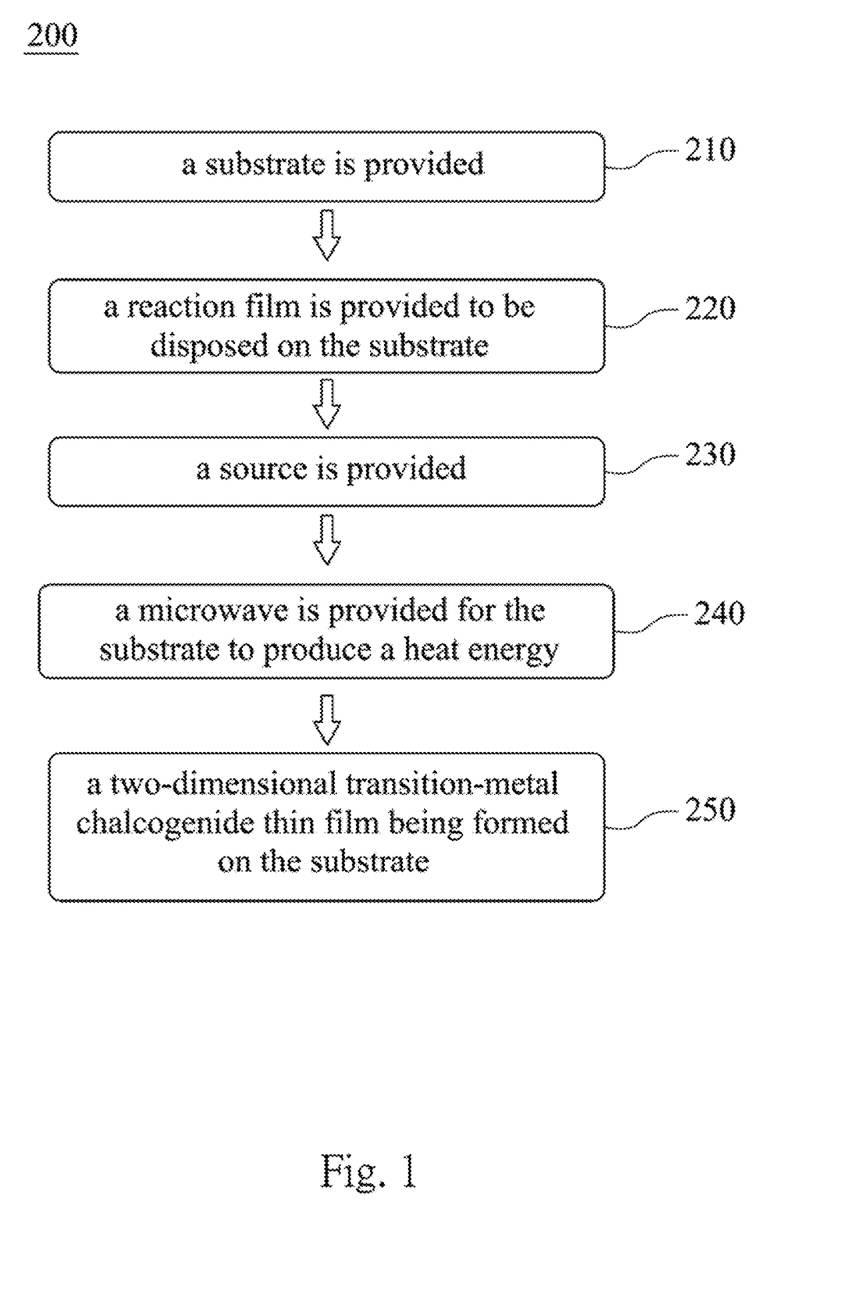
FIG. 1 is a flow diagram of a manufacturing method of a two-dimensional transition-metal chalcogenide thin film according to one embodiment of the present disclosure.

FIG. 1 is a flow diagram of a manufacturing method 200 of a two-dimensional transition-metal chalcogenide thin film according to one embodiment of the present disclosure. In FIG. 1, a manufacturing method 200 of two-dimensional transition-metal thin film includes Steps 210 to 250 as below:

In Step 210, a substrate is provided, wherein the substrate is made of material having dipole moments.

In Step 220, a reaction film is provided to be disposed on the substrate, wherein the reaction film has a predefined thickness and a transition-metal compound.

In Step 230, a source is provided, wherein the source includes S, Se, or Te.

In Step 240; a microwave is provided for the substrate to produce a heat energy.

And in Step 250, the heat energy is provided to the reaction film and the source. A chemical reaction takes place, and a two-dimensional transition-metal chalcogenide thin film is formed on the substrate.

Therefore, heating the substrate by the microwave directly instead of heating the whole reaction space can save the heat energy. Moreover, the substrate can be heated up quickly due to the microwave; thus a reacting time is shortened to decrease the process time and to save the cost. Furthermore, each of the elements can align along predefined direction by controlling the value of the predefined thickness of the reaction film; hence, the two-dimensional transition-metal chalcogenide thin film will has better performances. The manufacturing method will be described in detail in the following paragraphs.

Figure 2:
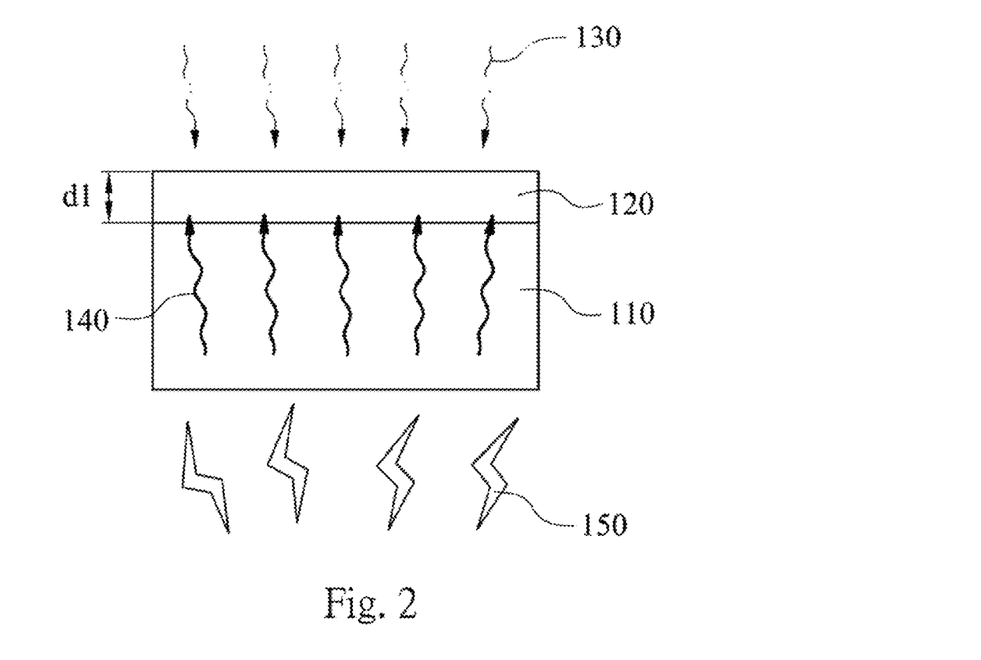
FIG. 2 is a schematic view of one manufacturing condition of the manufacturing method according to one example of the embodiment in FIG. 1.
Figure 3:
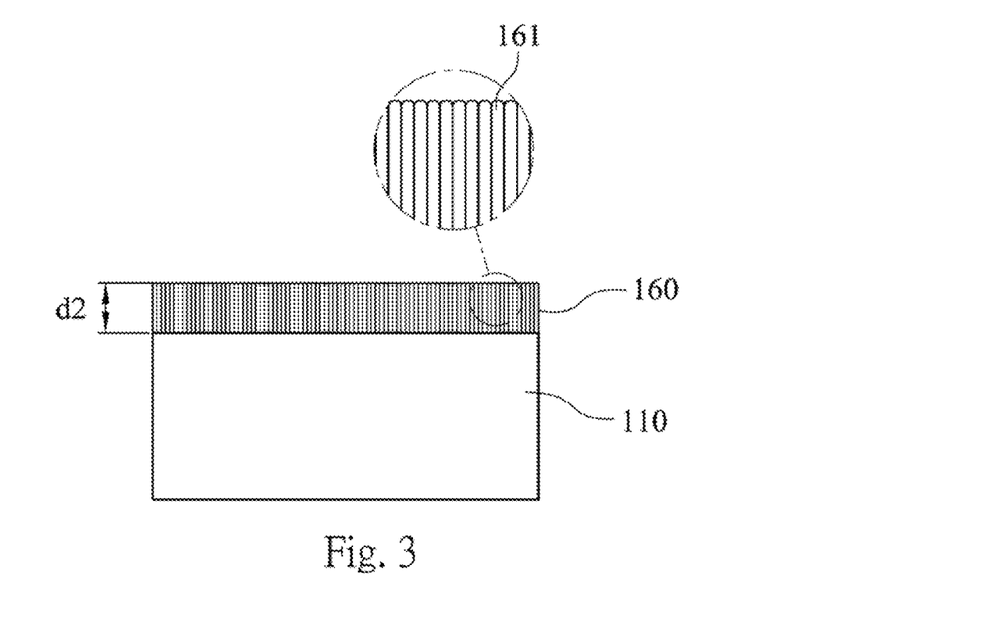
FIG. 3 is a schematic view of a two-dimensional transition-metal thin film made with the manufacturing condition as illustrated in FIG. 2.

FIG. 2 is a schematic view of one manufacturing condition of the manufacturing method 200 according to one example of the embodiment in FIG. 1, and FIG. 3 is a schematic view of a two-dimensional transition-metal thin film 160 made with the manufacturing condition as illustrated in FIG. 2. The reaction film 120 is disposed on the substrate 110, and the reaction film 120 is made of material containing a transition-metal compound, such as $WO_3$, $MO_3$ or $TiO_3$. These transition compounds have such a characteristic that can react with S, Se or Te to from a layer structure. The substrate 110 is made of material having dipole moments. For example, the substrate 110 can be made of but is limited to SiC or $LiFeBO_3$.

As microwave 150 is providing to the substrate 110, and molecules in the substrate 110, which have dipole moments, are affected by a magnet filed of microwave 150 to align from disorder to order following a polarized direction of the magnet field. Therefore, while the molecules in the substrate 110 is vibrating and rotating quickly by the magnet field of microwave 150, a large amount of the heat energy 140 is released due to the rubbing phenomenon between the molecules. Accordingly, the heat energy 140 can be provided to the reaction film 120 and the source 130. Because of the effect described above, the substrate 110 can be heated up quickly so that a process can be done within a short time period. The time period of the microwave 150 acting on the substrate 110 is larger than or equal to 30 seconds and smaller than or equal to 600 seconds.

In the embodiment of FIGS. 2 and 3, the source 130 is provided in a form of gas and reacts with the reaction film 120. The reaction film 120 and the source 130 absorb the heat energy 140 and the chemical reaction takes place therebetween. After the chemical reaction, the reaction film 120 and the source 130, as shown in FIG. 3, form a two-dimensional transition-metal chalcogenide thin film 160 on the substrate 110. A component of the element 161 depends on a component of the reaction film 120 and a component the source 130. For example, when the reaction film 120 is made of $WO_3$ and the source 130 is Se, the chemical reaction formula is $WO_3+2Se \rightarrow WSe_2$. Therefore, the elements 161 are $WSe_2$.

There are two factors which influence the heat dissipation ability of two-dimensional transition-metal material, one is the dissipation direction, and the other is the structural defects of the two-dimensional transition-metal material itself, such as defect, rotational misalignment, grain boundary, etc. The in-plan thermal conductivity is higher than the cross-plane thermal conductivity, and phonon scattering occurs between or at the interfaces due to the structural defects result in higher thermal resistance.

Therefore, the substrate 110 is deemed as a huge heat sink in the present disclosure, and the heat energy will flow downward to the substrate 110 to dissipate while cooling. However, as described above, the in-plane thermal conductivity is higher, and if the value of the predefined thickness d1 of the reaction film 120 is larger, a value of a forming thickness d2 of the two-dimensional transition-metal chalcogenide thin film 160 is also larger. Consequently, the heat energy will tend to transfer along the in-plane direction to rapidly achieve thermal equilibrium with environment so that the elements 161 align along a direction perpendicular to the substrate 110.

On the other hand, if the value of the predefined thickness d1 of the reaction film 120 is smaller, the value of the forming thickness d2 of the two-dimensional transition-metal chalcogenide thin film 160 is also smaller. Furthermore, the thermal conductivity of the elements 161 will be affected due to the nature turbostratic structure caused by the manufacturing process in the present disclosure. And the in-plane thermal conductivity is substantially equal to the cross-plane thermal conductivity because of the structural defects while cooling, which results in the elements 161 align along the direction parallel to the substrate 110.

The reaction film 120 can be formed on the substrate 110 by evaporation sputtering process so as to defined the value of the predefined thickness d1 of the reaction film 120 and to achieve the goal that each of the elements 161 aligns along a predefined direction. As shown in FIG. 3, the predefined direction of each of the elements 161 is substantially perpendicular to the substrate 110. Besides, the value of the predefined thickness d1 of the reaction film 120 is equal to the value of the forming thickness d2 of the two-dimensional transition-metal chalcogenide thin film 160, and it can be understood that through defining the value of the predefined thickness d2, the alignment direction of the elements 161 as well as the value of the forming thickness d2 can be defined.

The reaction film 120 can be formed on the substrate 110 via electron beam evaporator in the embodiment of FIGS. 2 and 3 and the value of the predefined thickness d1 is given as 20 nm during the evaporation process. In other embodiment, the reaction film 120 can be formed on the substrate 110 via other evaporation method or sputtering method, and the value of the predefined thickness d1 can be adjusted depending on different demands. For example, the value of the predefined thickness can be larger than or equal to 18 nm while the predefined direction is perpendicular to the substrate 110, or the value of the predefined thickness d1 can be smaller than 18 nm e.g. 8 nm) while the predefined direction is parallel to the substrate 110.

Figure 4:
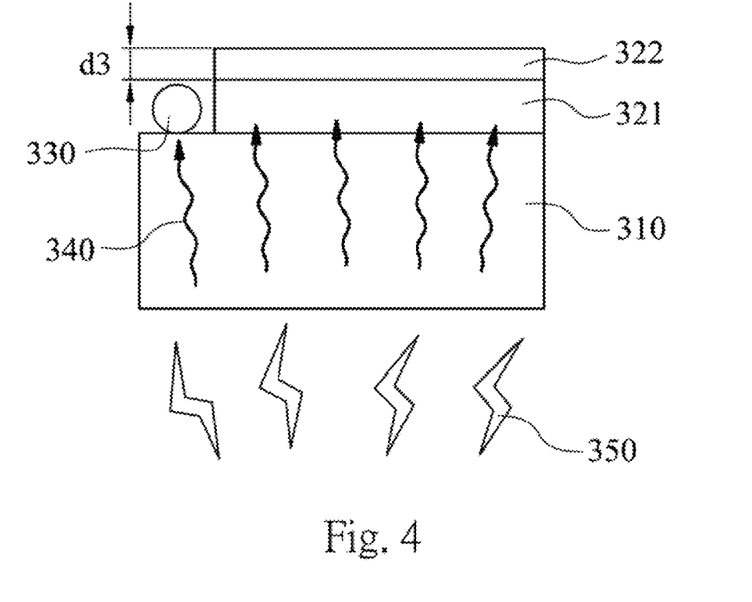
FIG. 4 is a schematic view of one manufacturing condition of the manufacturing method according to another example of the embodiment in FIG. 1.
Figure 5:
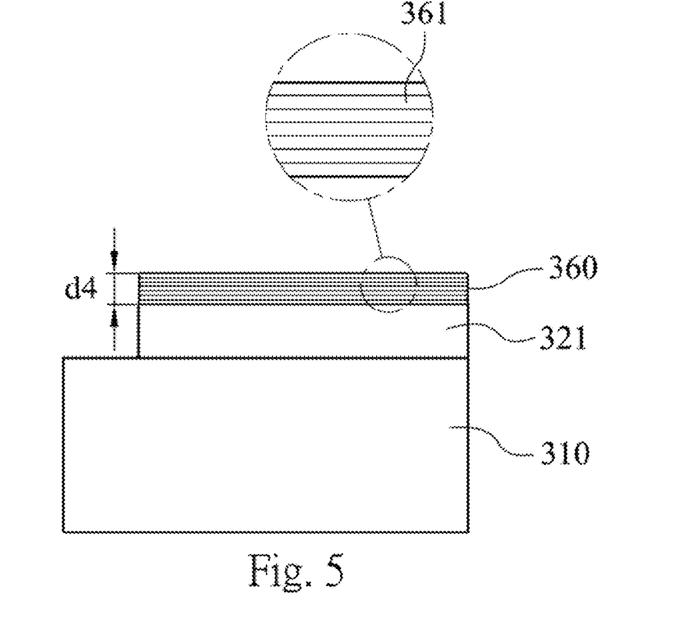
FIG. 5 is a schematic view of a two-dimensional transition-metal thin film made with the manufacturing condition as illustrated in FIG. 4.

FIG. 4 is a schematic view of one manufacturing condition of the manufacturing method 200 according to another example of the embodiment in FIG. 1, and FIG. 5 is a schematic view of a two-dimensional transition-metal thin film 360 made with the manufacturing condition as illustrated in FIG. 4. The manufacturing method 200 further includes providing a base 321. The base 321 is disposed on the substrate 310 and the reaction film 322 is disposed on the base 321. The reaction film 322 is smaplingly made of $MoO_3$. The base 321 which has a thickness of 0.6 mm is made of $SiO_2$ and the substrate 310 is made of SiC. In other embodiment, the reaction film 322 can be made of $WO_3$ or other material with a transition-metal compound. The base 321 can be made of Si or sapphire, and the substrate 310 can be made of other material having dipole moments. But the materials of the reaction film 322, the base 321 and the substrate 310 of the present disclosure will not be limited to the above descriptions.

The reaction film 322 is formed on the base 321 via electron beam evaporator in the embodiment of FIGS. 4 and 5. A difference between this embodiment and the embodiment shown in FIGS. 2 to 3 is that the reaction film 322 is directly formed on the base 321 instead of the substrate 310. Hence, the substrate 321 will not be limited to be made of materials having dipole moments so as to increase the applying flexibility of the manufacturing method 200 of the present disclosure.

The source 330 is disposed on the substrate 310 in a form of solid, and the source 330 is a Se-ingot in this embodiment. The substrate 310 produces a heat energy 340 while exposed in microwave 350, and the source 330 is gasified by the heat energy 340 to react with the reaction film 322. As shown in FIG. 5, the two-dimensional transition-metal chalcogenide thin film 360 is formed accordingly, and the two-dimensional transition-metal chalcogenide thin film 360 includes a plurality of elements 361 which align along a predefined direction.

The power of the microwave 350 is preferably larger than or equal is 100 W and smaller than or equal to 700 W in the embodiment of FIGS. 4 and 5. Precisely, the power is larger than or equal to 100 W and smaller than or equal to 500 W. The source 330 which is in a form of solid may not easily be gasified while the power is smaller than 100W, and the elements 361 may be easily evaporated, which ends up forming an uneven thin film, while the power is larger than 700 W. Therefore, when the power is larger than or equal to 100 W and smaller than or equal to 500 W, easily to for an even two-dimension transition-metal chalcogenide thin file 360.

Determining the value of the predefined thickness d3, as describing above, can make the elements 361 align along the predefined direction. The value of the predefined thickness d3 is 10 nm; therefore, the elements 361 align a direction parallel to the substrate 310. Besides, the value of the forming thickness d4 of the two-dimensional transition-metal chalcogenide thin film 360 is substantially equal to the value of the predefined thickness d3.

In another embodiment, while forming the reaction film 322 on the base 321, a predefined pattern can be made on the reaction film 322 using the photolithography process. Accordingly, when the two-dimensional be remanded so as to facilitate applying in the future. In addition to the photolithography process, the predefined pattern can be formed on the reaction film 322 via other method and process, and it is not limited to this.

Figure 6A:
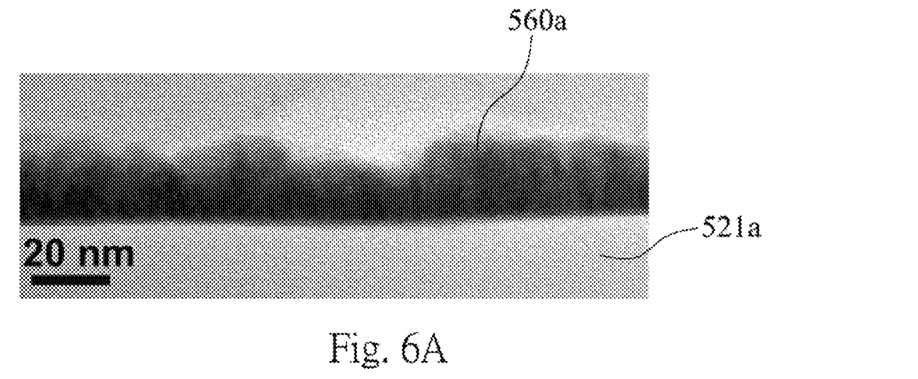
FIG. 6A is a TEM view of a two-dimensional transition-metal chalcogenide thin film manufacturing by the manufacturing method according to a first example of the embodiment of FIG. 1.
Figure 6B:
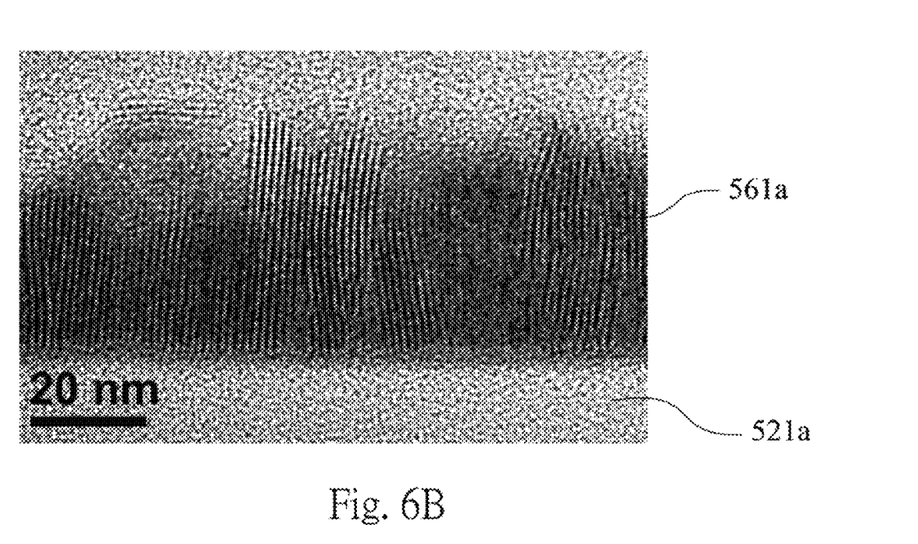
FIG. 6B is a magnified view of the two-dimensional transition-metal chalcogenide thin film as illustrated in FIG. 6A.

FIG. 6A is a TEM view of a two-dimensional transition-metal chalcogenide thin film 560a manufacturing by the manufacturing method according to a first example of the embodiment of FIG. 1, and FIG. 6B is a magnified view of the two-dimensional transition-metal chalcogenide thin film 560a as illustrated in FIG. 6A. The first embodiment will be described in detail in the following paragraphs.

In the first embodiment, a SiC substrate (not shown) is provided first, a base 521a and a reaction film (not shown) are provided accordingly. The base 521a is made of $SiO_2$. The reaction film is made of $WO_3$ and is formed on the base 521a via electron beam evaporator. The base 521a is rotated while evaporating so as to increase the forming uniformity of the reaction film. The thickness of the reaction film is given as 20 nm, and the evaporating speed is 0.1/s as the vacuum pressure is $5 \times 10^{-6}$ toor. Then put the base 521a and the reaction film into a vacuum tube (not shown), and put the vacuum tube on the substrate. The position of the base 521a and the reaction film is according to the substrate, and a source (not shown) is also put into the vacuum tube to be according to the substrate.

A microwave system which provides a microwave (not shown) has an exchange-frequency of 2.45 GHz. The microwave system includes a reaction room (not shown) to receive the vacuum tube and the substrate. The substrate produces a heat energy (not shown) while the microwave is delivered into the reaction room. Thus the heat energy can force the reaction film and the source to react with each other, and a two-dimensional transition-metal chalcogenide thin film 560a is formed on the substrate. In the first embodiment, the microwave acts on the substrate for 3 minutes with a power of 500 W, and a value of the forming thickness of the two-dimensional transition-metal chalcogenide thin film 560a is 20 nm.

It can be seen from FIGS. 6A and 6B that the two-dimensional transition-metal chalcogenide thin film 560a can be successfully formed on the base 521a by using the manufacturing method of the present disclosure. And the elements 561a containing by the two-dimensional transition-metal thin film 560a can align along a direction perpendicular to the base 521a.

Figure 7A:
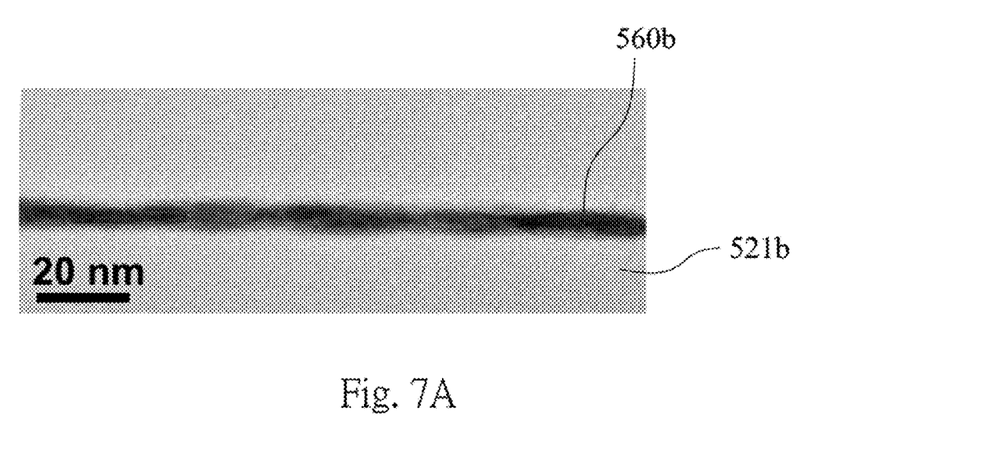
FIG. 7A is a TEM view of a two-dimensional transition-metal chalcogenide thin film manufacturing by the manufacturing method according to a second example of the embodiment of FIG. 1.
Figure 7B:
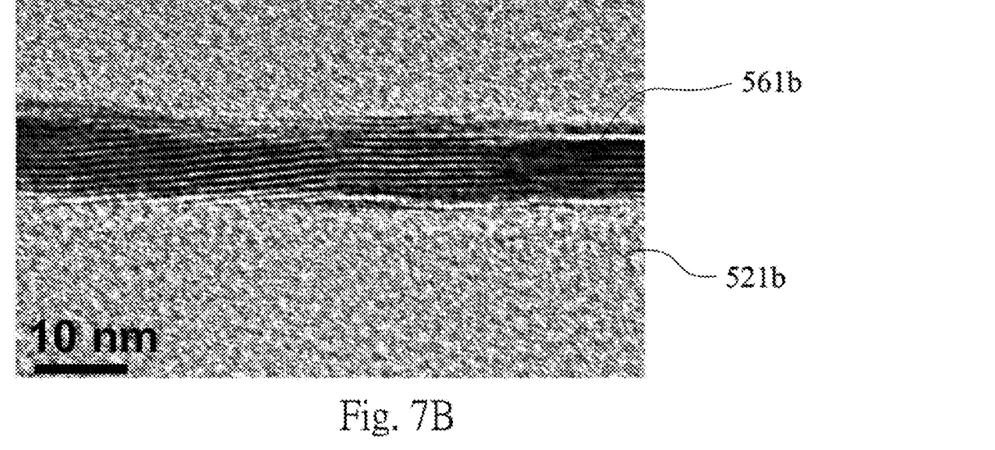
FIG. 7B is a magnified view of the two-dimensional transition-metal chalcogenide thin film as illustrated in FIG. 7A.

FIG. 7A is a TEM view of a two-dimensional transition-metal chalcogenide thin film 560b manufacturing by the manufacturing method according to a second example of the embodiment of FIG. 1, and FIG. 7B is a magnified view of the two-dimensional transition-metal chalcogenide thin film 560b as illustrated in FIG. 7A. The second embodiment will be described in detail in the following paragraphs.

In the second embodiment, a SIC substrate (not shown) is provided first, a base 521b and a reaction film (not shown) are provided accordingly. The base 521b is made of $SiO_2$. The reaction film is made of $WO_3$ and is formed on the base 521b via electron beam evaporator. The base 521b is rotated while evaporating so as to increase the forming uniformity of the reaction film. The thickness of the reaction film is given as 10 nm, and the evaporating speed is 0.11 as the vacuum pressure is $5 \times 10^{-6}$ tour. Then put the base 521b and the reaction film into a vacuum tube (not shown), and put the vacuum tube on the substrate. The position of the base 521b and the reaction film is according to the substrate, and a source not shown) is also put into the vacuum tube to be according to the substrate.

A microwave system which provides a microwave (not shown) has an exchange-frequency of 2.45 GHz. The microwave system includes a reaction room (not shown) to receive the vacuum tube and the substrate. The substrate produces a heat energy (not shown) while the microwave is delivered into the reaction room. Thus the heat energy can force the reaction film and the source to react with each other, and a two-dimensional transition-metal chalcogenide thin film 560b is formed on the substrate. In the second embodiment, the microwave acts on the substrate for 3 minutes with a power of 300 W, and a value of the forming thickness of the two-dimensional transition-metal chalcogenide thin film 560b is 10 nm.

It can be seen from FIGS. 7A and 7B that the two-dimensional transition-metal chalcogenide thin film 50b can be successfully formed on the base 521b by using the manufacturing method of the present disclosure. And the elements 561b containing by the two-dimensional transition-metal thin film 560b can align along a direction perpendicular to the base 521b.

Figure 8A:
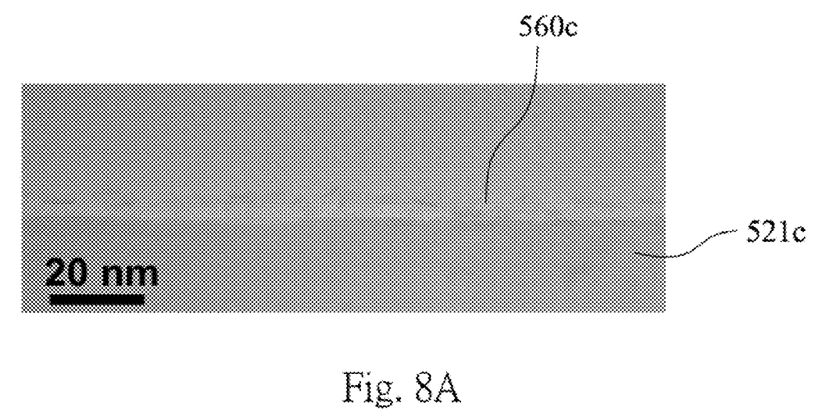
FIG. 8A is a TEM view of a two-dimensional transition-metal chalcogenide thin film manufacturing by the manufacturing method according to a third example of the embodiment of FIG. 1.
Figure 8B:
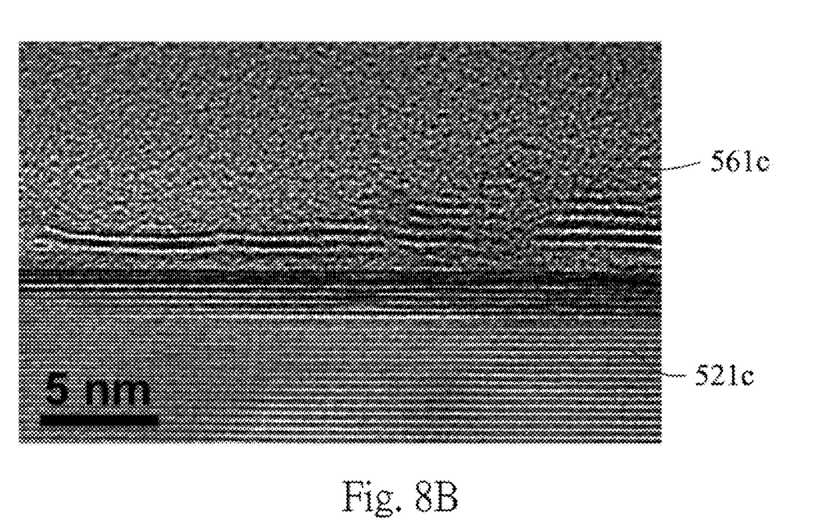
FIG. 8B is a magnified view of the two-dimensional transition-metal chalcogenide thin film as illustrated in FIG. 8A.

FIG. 8A is a TEM view of a two-dimensional transition-metal chalcogenide thin film 560c manufacturing by the manufacturing method according to a third example of the embodiment of FIG. 1, and FIG. 8B is a magnified view of the two-dimensional transition-metal chalcogenide thin film 560c as illustrated in FIG. 8A. The third embodiment will be described in detail in the following paragraphs.

In the third embodiment, a SiC substrate (not shown) is provided first, a base 521c and a reaction file (not shown) are provided accordingly. The base 521c is made of sapphire which is made by Czochralsk method. The reaction film is made of $WO_3$ and is formed on the base 521c via electron beam evaporator. The base 521c is rotated while evaporating so as to increase the forming uniformity of the reaction film. The thickness of the reaction film is given as 4 nm, and the evaporating speed is 0.1/s as the vacuum pressure is $5 \times 10^{-6}$ toor. Then put the base 521c and the reaction film into a vacuum tube not shown), and put the vacuum tube on the substrate. The position of the base 521c and the reaction film is according to the substrate, and a source (not shown) is also put into the vacuum tube to be according to the substrate.

A microwave system which provides a microwave (not shown) has an exchange-frequency of 2.45 GHz. The microwave system includes a reaction room (not shown) to receive the vacuum tube and the substrate. The substrate produces a heat energy (not shown) while the microwave is delivered into the reaction room. Thus the heat energy can force the reaction film and the source to react with each other, and a two-dimensional transition-metal chalcogenide thin film 560c is formed on the substrate. In the third embodiment the microwave acts on the substrate for 3 minutes with a power of 200 W, and a value of the forming thickness of the two-dimensional transition-meta chalcogenide thin film 560c is 4 nm.

It can be seen from FIGS. 8A and 8B that the two-dimensional transition-metal chalcogenide thin film 560c can be successfully formed on the base 521c by using the manufacturing method of the present disclosure. And the elements 561c containing by the two-dimensional transition-metal thin 560c can align along a direction perpendicular to the base 521c.

Therefore, by using the manufacturing method of the present disclosure, as the embodiments describing above, the substrate having dipole moments can produce a heat energy by exposed in the microwave. The heat energy can directly deliver to the base and the reaction film which are disposed on the substrate, and a two-dimensional transition-metal chalcogenide thin film can be successfully manufactured. Besides, if the process is running without the base and the reaction film is disposed on the substrate directly, the reaction film can also absorb the heat energy to react with the source; therefore, the two-dimensional transition-metal chalcogenide thin film is formed on the substrate directly. Furthermore, the elements of the reaction film can align along a predefined direction by defining the value of the predefined thickness.

Because the structure of the two-dimensional transition-metal chalcogenide thin film will has more edges to provide more active sites, while the elements aligning a direction perpendicular to the substrate, the activity and the catalyzing effect will increase; therefore, it assists the application of producing Hydrogen and being sensors. Moreover, a PN junction is formed while the substrate is made of SC and the two-dimensional transition-metal chalcogenide thin film is directly formed on the substrate. The usage will become wildly.

Base on the embodiments described above, the advantages of the present disclosure are listed as follows.

1. Through heating the substrate via the microwave, heating the whole reaction space can be avoided so as to save the heat energy and the manufacturing cost caused by heating.

2. The substrate is heated quickly because of the microwave; hence, a reaction time period is shortened to shorten the manufacturing time as well as to save the manufacturing cost.

3. Through defining the value of the predefined thickness of the reaction film, the elements can align along a predefined direction so that the two-dimensional transition-metal chalcogenide thin film will have better performances.

4. If the manufacturing method further includes providing a base, the two-dimensional transition-metal chalcogenide thin film can be formed on different bases based on different demands. The manufacturing process will become more flexible.

5. Because the value of the predefined thickness is substantially equal to the value of the forming thickness the value of forming thickness of the two-dimensional transition-metal chalcogenide thin film can be defined.

6. While the reaction film is formed on the base or the substrate by evaporation or sputtering process, it assists the application, such as an application of circuit, in the future if a predefined pattern is further formed on the reaction film by photolithography process.

7. If the source disposed on the substrate is in a form of solid and is gasified by heating, a gas passage in the reaction room can be omitted so that the structures of the manufacturing equipments will become simply.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A manufacturing method of a two-dimensional transition-metal chalcogenide thin film, comprising:
    providing a substrate, wherein the substrate is made of material having dipole moments;
    providing a reaction film disposed on the substrate, wherein the reaction film has a predefined thickness and comprises a transition-metal compound;
    providing a source, wherein the source comprises S, Se or Te; and
    providing a microwave, wherein the substrate is heated by the microwave to produce a heat energy to the reaction film and the source, thus a chemical reaction takes place and the two-dimensional transition-metal chalcogenide thin film formed on the substrate;
    wherein the two-dimensional transition-metal thin film comprises a plurality of elements, and each of the elements aligns along a predefined direction by controlling a value of the predefined thickness.

2. The manufacturing method of claim 1, wherein the predefined direction is substantially perpendicular to the substrate when controlling the value of the predefined thickness to be larger than or equal to 18 nm.

3. The manufacturing method of claim 2, wherein the predefined direction substantially perpendicular to the substrate when controlling the value of the predefined thickness to be larger than or equal to 20 nm.

4. The manufacturing method of claim 1, wherein a time period of the microwave acting on the substrate is larger than or equal to 30 seconds and smaller than or equal to 600 seconds.

5. The manufacturing method of claim 1, wherein a value of a forming thickness of the two-dimensional transition-metal chalcogenide thin film is defined by the value of the predefined thickness.

6. The manufacturing method of claim 1, wherein the substrate is made of SiC, the reaction film is made of $WO_3$ or $MoO_3$, and the source is Se.

7. The manufacturing method of claim 1, wherein the predefined direction is substantially perpendicular to or parallel to the substrate.

8. The manufacturing method of claim 1, wherein the source is in a form of gas when touching the reaction film.

9. The manufacturing method of claim 1, further comprises:
    providing a base, wherein the base is disposed on the substrate, and the reaction film is disposed on the base.

10. The manufacturing method of claim 9, wherein the substrate is made of SiC, the base is made of $SiO_2$, Si or sapphire, the reaction film is made of $WO_3$ or $MoO_3$, and the source is Se.

11. The manufacturing method of claim 9, wherein the source is disposed on the substrate in a form of solid and is gasified by the heat energy.

12. The manufacturing method as claim 9, wherein the reaction film is formed on the base by evaporation or sputtering process.

13. The manufacturing method of claim 12, wherein the reaction film is formed with a predefined pattern by photolithography process.

14. The manufacturing method of claim 12, wherein a value of a forming thickness of the two-dimensional transition-metal chalcogenide thin film is substantially equal to the value of the predefined thickness.

15. The manufacturing method of claim 9, wherein a power of the microwave is larger than or equal to 100 W and smaller than or equal to 700 W.

* * * * *